US007851012B2

(12) United States Patent
Konno

(10) Patent No.: US 7,851,012 B2
(45) Date of Patent: *Dec. 14, 2010

(54) PASTE FOR SOLAR CELL ELECTRODES, METHOD FOR THE MANUFACTURE OF SOLAR CELL ELECTRODES, AND THE SOLAR CELL

(75) Inventor: Takuya Konno, Kanagawa (JP)

(73) Assignee: E.I. du Pont de Nemours and Company, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/730,309

(22) Filed: Mar. 24, 2010

(65) Prior Publication Data

US 2010/0175754 A1 Jul. 15, 2010

Related U.S. Application Data

(63) Continuation of application No. 11/639,944, filed on Dec. 15, 2006, now Pat. No. 7,727,424.

(51) Int. Cl.

| | |
|---|---|
| ***H01B 1/16*** | (2006.01) |
| ***B05D 5/12*** | (2006.01) |
| ***H01L 31/0224*** | (2006.01) |

(52) U.S. Cl. .......................... 427/74; 252/514; 136/256

(58) Field of Classification Search ................. 252/514; 136/252, 256; 427/58, 74; 257/252, 253

See application file for complete search history.

(56) References Cited

U.S. PATENT DOCUMENTS

| | | | | |
|---|---|---|---|---|
| 4,636,332 | A | 1/1987 | Craig et al. | |
| 5,162,062 | A | 11/1992 | Carroll et al. | |
| 5,183,784 | A | 2/1993 | Nguyen et al. | |
| 5,468,695 | A | 11/1995 | Carroll et al. | |
| 5,795,501 | A | 8/1998 | Kano | |
| 6,071,437 | A * | 6/2000 | Oya | 252/514 |
| 7,435,361 | B2 * | 10/2008 | Carroll et al. | 252/514 |
| 2007/0104878 | A1 * | 5/2007 | Kodas et al. | 427/375 |

FOREIGN PATENT DOCUMENTS

| | | | |
|---|---|---|---|
| EP | 0474879 | A1 | 10/1991 |
| JP | 60-176948 | A | 9/1985 |
| JP | 2005-243500 | A | 9/2005 |

* cited by examiner

*Primary Examiner*—Mark Kopec

(57) ABSTRACT

Disclosed is an electrically conducting paste comprising a silver powder, a glass frit, a resin binder and a sintering inhibitor. The paste is used in the manufacture of solar cell electrodes by applying the electrically conducting paste to a substrate and then firing of the coated substrate.

11 Claims, 1 Drawing Sheet

110
110
102
112
114
112
114
112

PASTE FOR SOLAR CELL ELECTRODES, METHOD FOR THE MANUFACTURE OF SOLAR CELL ELECTRODES, AND THE SOLAR CELL

This application is a continuation application of Ser. No. 11/639,944, now U.S. Pat. No. 7,727,424, filed on Dec. 15, 2006.

TECHNICAL FIELD

The present invention relates to solar cells. More specifically, it relates to a paste for use in the manufacture of electrodes in the solar cell, a method for the manufacture of solar cell electrodes using said paste, and the solar cell that can be obtained.

TECHNICAL BACKGROUND

During the preparation of the solar cell electrode, the electrode is formed on the side with the formation of an anti-reflecting preventing film. A common method for manufacturing the electrode involves a procedure for coating a paste containing a silver powder or other electrical conductor, a glass frit, a resin binder and, if necessary, an additive on a anti-reflecting layer, followed by firing.

In order to increase the power generation characteristics of the solar cell, the characteristics of the electrode are important. For example, by decreasing the resistance of the electrode, the power generation efficiency is increased. In order to achieve this objective, a variety of procedures have been proposed.

For example, in Japanese Kokai Patent Application No. 2005-243500, a technology for preparing electrodes with good conduction characteristics has been disclosed. Specifically, for an electrically conducting paste containing an organic binder, a solvent, a glass frit, an electrically conductive powder, and at least one metal selected from Ti, Bi, Zn, Y, In and Mo, or a compound there of, an electrically conductive paste having an average metal particle diameter between 0.001 μm and 0.1 ηm can be obtained with excellent conduction and adhesion characteristics.

SUMMARY OF THE INVENTION

The present invention relates to a paste for solar cell electrodes containing a silver powder, a glass frit, a resin binder and a sintering inhibitor. The invention further relates to a method for the manufacture of solar cell electrodes including a step for coating a paste containing a silver powder, a glass frit, a resin binder and a sintering inhibitor on a solar cell substrate, and a step for firing the previously mentioned paste coating.

In the present invention, the sintering inhibitor is preferably a metal resinate, ideally rhodium resinate. The content of the metal resinate is 0.002-0.05 wt % calculated as metal with respect to the total weight of the paste. The present invention includes solar cells with electrodes formed by the described method.

DETAILED DESCRIPTION OF THE INVENTION

Figure 1A:
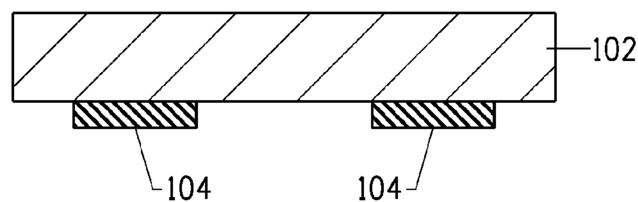
FIG. 1, diagrams (a) through (d), explains the manufacture of a solar cell using the electrically conducting paste of the present invention. 102: Si substrate; 104: Electrically conducting paste for the back Ag electrode; 106: Paste for the back Al electrode; 108: Electrically conducting paste for the light-receiving side electrode; 110: Light-receiving side Ag electrode; 112: Back Al electrode; 114: Back Ag electrode.

During the firing of the paste, owing to the shrinkage of the coated film, the contact resistance increases and/or micro cracks are formed. These problems adversely affect the characteristics of the solar cell. For example, the plane uniformity of the solar cell may decrease or the conversion efficiency of the solar cell may drop.

The present invention aims to solve these problems associated with the firing of the paste and to improve the characteristics of the electrode obtained as well as the characteristics of the solar cell.

The present invention is an electrically conducting paste capable of providing the characteristics mentioned previously. The paste contains a silver powder, a glass frit, a resin binder and a sintering inhibitor.

Furthermore, the present invention includes a method for manufacturing solar cell electrodes using the electrically conductive paste mentioned previously. This method includes a step for coating a paste containing a silver powder, a glass frit, a resin binder and a sintering inhibitor on a solar cell substrate, and a step for firing the paste coating. In the electrically conducting paste and the manufacture of the solar cell electrodes mentioned previously, it is preferable for the sintering inhibitor to be a metal resinate, most preferably rhodium resinate. The content of the metal is 0.002-0.05 wt. % of the paste.

The present invention includes a solar cell with electrodes formed by the method described previously.

The effect of the invention is to inhibit any Increase in the contact resistance and micro crack formation, so that the characteristics of the resulting solar cell are improved.

The present invention is based on the addition of a sintering inhibitor into the paste in order to avoid the drawbacks due to sintering.

The electrically conducting paste of the present invention is used to form the surface side electrodes of the solar cell.

The various components of the electrically conducting paste of the present invention will be explained in the following discussion.

1. Electrically Conducting Metal

Silver (Ag) particles are best suited as the electrically conducting metal in the electrically conducting paste of the present invention. It is preferable that the silver particles be flaky or spherical in shape. There are no special restrictions on the particle diameters of the silver particles from the viewpoint of technological effectiveness when used as common electrically conducting paste. However, since the particle diameters affect the sintering characteristics of silver (for example, large silver particles are sintered more slowly than silver particles of small particle diameter), the range of 0.1-10.0 μm is preferred. Furthermore, it is also necessary that the silver particles have particle diameters appropriate for the method used to coat the electrically conducting paste (for example, screen printing). In the present invention, it is possible to mix two or more types of silver particles of different diameters.

The silver should be of ordinary high purity (99+ %). However, depending on the electrical requirements of the electrode pattern, less pure silver can also be used.

There are no special restrictions on the content of the electrically conducting metal as long as it can achieve the objective of the present invention. However, in the case of silver particles, a 40-90 wt % content based on the weight of the electrically conducting paste is preferable.

2. Glass Frit

The electrically conducting paste in the present invention should contain a glass frit as the inorganic binder. The glass frit used in the present invention has a softening point of 450-550° C. and the electrically conducting paste is fired at 600-800° C., sintered and moistened and, furthermore, adheres properly to the silicon substrate. If the softening point is less than 450° C., sintering will proceed and there may be cases in which the effectiveness of the present invention cannot be achieved sufficiently. On the other hand, if the softening point is more than 550° C., a sufficient flow of melt does not occur during firing, so that the adhesion may be inadequate and the liquid-phase sintering of silver cannot be accelerated.

Here, the "softening point" is the softening point obtained by the fiber elongation method of ASTM C338-57.

The chemical composition of the glass frit is not important in the present invention. Any glass frit suitable for use in electrically conducting pastes for electronic materials is acceptable. For example, a lead borosilicate glass and so on can be used. Lead silicate and lead borosilicate glasses are excellent materials in the present invention from the viewpoint of both the range of the softening point and the glass fusion characteristics. In addition, zinc borosilicate or other lead-free glasses can be used.

There are no special restrictions on the content of the glass frit as the inorganic binder, as long as it is high enough to achieve the objective of the present invention. Relative to the weight of the electrically conductive paste, the content should be 0.5-10.0 wt %, and preferably 1.0-3.0 wt %.

If the amount of inorganic binder is less than 0.5 wt %, the adhesion may be insufficient. If the amount of inorganic binder exceeds 10.0 wt %, owing to glass floating or the like subsequent soldering may be hindered.

3. Resin Binder

The electrically conducting paste in the present invention contains a resin binder. In the present specifications document, the "resin binder" is a mixture of a polymer and a thinner. Therefore, the resin binder may also contain an organic liquid (also called the thinner). In the present invention, a resin binder containing an organic liquid is preferred. If the viscosity is high an organic liquid can be added separately to adjust the viscosity.

In the present invention, any resin binder can be used, for example a pine oil solution or an ethylene glycol monobutyl ether monoacetate solution of a resin (polymethacrylate or the like) or ethyl cellulose, a terpineol solution of ethyl cellulose, etc. In the present invention, it is preferable to use the terpineol solution of ethyl cellulose (ethyl cellulose content=5 wt % to 50 wt %). In the present invention, a solvent containing no polymer, for example, water or an organic liquid can be used as a viscosity-adjusting agent. Among the organic liquids that can be used are alcohols, alcoholesters (for example, acetate or propionate), and terpenes (such as pine oil, terpineol or the like).

The content of the resin binder is preferably 10-50 wt % of the weight of the electrically conducting paste.

4. Sintering Inhibitor

The composition of the present invention includes a sintering inhibitor. There are no special restrictions on the sintering inhibitor as long as it can prevent shrinkage of the coated film during the sintering of the electrically conducting paste. However, a metal resinate is appropriate. Possibilities include manganese resinate, titanium resinate, bismuth resinate, zinc resinate, palladium resinate, platinum resinate, zirconia resinate, boron resinate, barium resinate, aluminum resinate, copper resinate, gold resinate, indium resinate, iron resinate, nickel resinate, ruthenium resinate, rhodium resinate, silicon resinate, silver resinate, tin resinate, etc. The metal resinate can be expressed by the following general formula (I), for example.

$Me(XR)_n$ (I)

In the above formula, Me stands for manganese, titanium, bismuth, zinc, palladium, platinum, zirconia, boron, barium, aluminum, copper, gold, indium, iron, nickel, ruthenium, rhodium, silicon, silver or tin. X stands for —S—, —O—(CO)—, or —$SO_3$—. R is a linear, branched or cyclic hydrocarbon having 1 to 10 carbon atoms, such as methyl, ethyl, n-propyl, isopropyl, cyclopropyl, n-butyl, isobutyl, t-butyl, cyclobutyl, n-pentyl, cyclopentyl or other pentyl groups, n-hexyl, cyclohexyl or other hexyl groups, n-heptyl or other heptyl groups, n-octyl or other octyl groups, n-nonyl or other nonyl groups, n-decyl or other decyl groups, and n is 1, 2 or 3. The best sintering inhibitor for the present invention has Me=rhodium, i.e. rhodium resinate. Rhodium resinate can increase the power generation characteristics.

The content of sintering inhibitor is 0.002-0.05 wt % calculated as metal in the resinate.

5. Additives

In the electrically conducting paste in the present invention, a thickener and/or stabilizer and/or other common additives (such as a sintering aid or the like) may be added. Other common additives such as a dispersant, viscosity-adjusting agent, and so on can also be added. The amount of the additive depends on the desired characteristics of the resulting electrically conducting paste and can be chosen by people in the industry. The additives can also be added in multiple types.

As explained in the following, it is preferable for the viscosity of the electrically conducting paste in the present invention to lie in a specified range. To adjust the viscosity of the electrically conducting paste, a thickener can be added if necessary. Possible thickeners include the ones mentioned previously. The amount of thickener depends on the ultimate viscosity of the electrically conductive paste and can be determined by people in the industry.

The electrically conducting paste in the present invention can be manufactured conveniently by mixing the various components mentioned previously with a three-roll kneader. The electrically conducting paste is preferably coated on the desired portions of the backside of the solar cell by screen printing. When printing, the coating viscosity should lie in the specified range. The viscosity of the electrically conducting paste in the present invention is preferably 50-300 PaS when measured at 10 rpm and 25° C. using a #14 spindle with a Brookfield HBT viscometer and utility cup.

As described previously, the conducting paste in the present invention is to be used to form the electrodes with silver as the major component on the light-receiving side of the solar cell. In other words, the paste is printed on the light-receiving side of the solar cell and dried. Separately, on the backside of the solar cell, a backside electrode consisting of aluminum, silver or the like is formed. It is preferable that these electrodes be fired simultaneously.

Figure 1B:
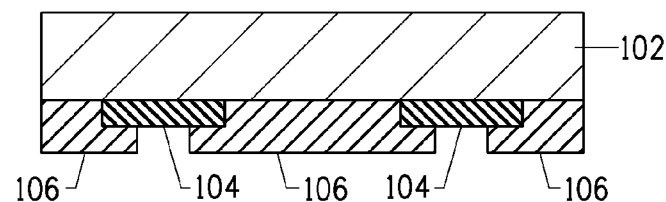
Figure 1C:
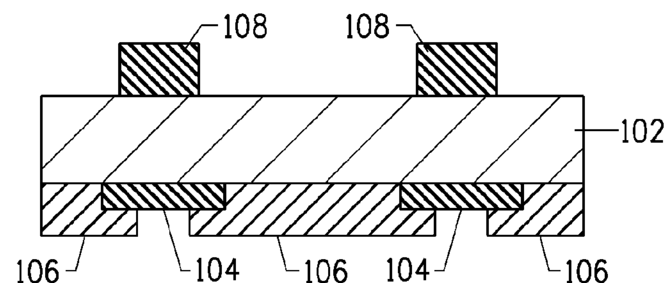
Figure 1D:
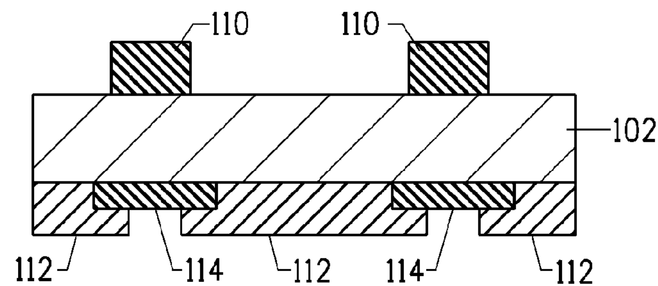

An example of solar cell preparation using the electrically conductive paste of the present invention will be explained with reference to FIG. 1 in the following.

First, the Si substrate (102) is prepared. On the back of this substrate, the electrically conductive paste (104) for solder connection is coated by screen printing and dried (FIG. 1(*a*)). As such an electrically conductive paste, the conventional material, for example, Ag electrically conductive paste containing silver particles, glass particles and a resin binder can be used. Next, the aluminum paste (106) for the backside electrode in the solar cell (there are no special restrictions as long as it is for the solar cell use, for example, PV333 and PV322 (the applicant of the present case)) is coated by screen printing or the like and dried (FIG. 1(*b*)). The drying temperature of the various pastes should be less than 180° C. Furthermore, the film thickness of the various electrodes on the backside after drying is 20-40 μm for the aluminum paste. It is preferable that the silver electrically conducting paste in the present invention be 15-30 μm thick. The size of the overlap between the aluminum paste and the silver electrically conducting paste should be about 0.5 mm to about 2.5 mm.

Next, on top of the light-receiving surface of the Si substrate, the electrically conducting paste (108) is coated by screen printing or the like and dried (FIG. 1(*c*)). The aluminum paste and the silver electrically conducting paste on the resulting substrate are then simultaneously fired in an infrared firing furnace at a temperature of, for example, about 600° C. to about 900° C. for about 2-15 min to obtain the desired solar cell (FIG. 1(*d*)).

The solar cell obtained using the electrically conducting paste in the present invention is shown in FIG. 1(*d*). The electrode (110) is formed from the electrically conducting paste on the light-receiving surface of the substrate (for example, the Si substrate) (102). The Al electrode (the first electrode) (112) with Al as the major component and the silver electrode (the second electrode) (114) with Ag as the major component are present on the backside.

EXAMPLES

1. Preparation of the Electrically Conducting Paste

Example 1

A mixture containing a silver powder with average diameter 2.2 μm and a Si—B—Pb—O type glass frit were prepared. To this mixture, a terpineol solution containing 20 wt % of ethyl cellulose was added as a resin binder. Terpineol thinner was to adjust the viscosity. Furthermore, a rhodium resinate sintering inhibitor with rhodium content 10 wt % (rhodium resinate (Resin acids and Rosin acids, rhodium salts (CA INDEX NAME)) CAS No.: 20845-92-5, rhodium content 10%) was added.

The contents of the various components are shown in Table 1. In other words, the silver powder was 84.0 wt %, the glass frit was 1.6 wt %, the resin binder was 12.6 wt %, the terpineol added for viscosity adjustment was 1.7 wt %, and the sintering inhibitor was 0.1 wt %.

After this mixture had been premixed with an all-purpose mixer, it was kneaded with a three-roll kneader to obtain the paste for the solar cell electrode. The particle diameters and other characteristics of the materials used are shown in Table 1.

Example 2

A paste for solar cell electrodes was obtained in the same manner as in Application Example 1, except that a mixture of a silver powder with an average particle diameter of 2.2 μm and a silver powder with an average particle diameter of 1.3 μm was used.

Example 3

A paste for solar cell electrodes was obtained in the same manner as in Application Example 1, except that a silver powder with an average particle diameter of 1.3 μm was used, the amount of viscosity-adjusting agent was changed to 1.1 wt %, and the amount of sintering inhibitor was changed to 0.3 wt %.

Comparative Example 1

A paste for solar cell electrodes was obtained in the same manner as in Application Example 1, except that the amount of viscosity-adjusting agent was changed to 1.4 wt % and no sintering inhibitor was added.

Comparative Example 2

A paste for solar cell electrodes was obtained in the same manner as in Application Example 2, except that the amount of viscosity-adjusting agent was changed to 1.4 wt % and no sintering inhibitor was added.

TABLE 1

| Component | Application Example 1 | Application Example 2 | Application Example 3 | Comparative Example 1 | Comparative Example 2 |
|---|---|---|---|---|---|
| Silver powder (particle diameter 2.2 μm) (wt %) | 83.5 | 7.0 | 0.0 | 83.5 | 70.0 |
| Silver powder (particle diameter 1.3 μm) (wt %) | 0.0 | 13.5 | 83.5 | 0.0 | 13.5 |
| Glass frit (wt %) | 1.6 | 1.6 | 1.6 | 1.6 | 1.6 |
| Resin binder (wt %) | 10.0 | 10.0 | 10.0 | 10.0 | 10.0 |
| Viscosity-adjusting agent (wt %) | 1.3 | 1.3 | 1.1 | 1.4 | 1.4 |
| Sintering inhibitor (wt %) | 0.1 | 0.1 | 0.3 | 0.0 | 0.0 |
| Sintering aid (wt %) | 3.5 | 3.5 | 3.5 | 3.5 | 3.5 |

2. Preparation of the Solar Cell

Solar cells were prepared using four of the pastes obtained. First, the Si substrate was prepared. On the backside of this Si substrate, the electrically conducting paste (the silver paste) for the solder connection use was coated by screen printing and dried. Next, aluminum paste (PV333 (by the patent applicant of the present case)) for the back electrode was coated by screen printing and dried so that it partly overlapped with the dried silver paste. The drying temperature for each paste was 120° C. Furthermore, the coating was carried out so that after drying the film thickness of each electrode on the back was 35 μm for the aluminum paste and 20 μm for the silver paste.

Furthermore, the paste of the present invention was coated on the light-receiving surface by screen printing and dried. The printing machine was manufactured by Price Company. A stainless wire 250 mesh with a 8"×10" frame was used as the mesh. The test pattern was a 1.5 inch square consisting of a finger line with a width of 100 microns and a bus line with a width of 2 mm. The film thickness after firing was 13 μm.

The resulting substrate was subjected to simultaneous firing of the coated pastes in an infrared furnace with a peak temperature of about 730° C. and IN-OUT for about 5 min to obtain the desired solar cell.

The solar cell using the electrically conducting paste in the present invention as shown is FIG. 1. The electrode (110) is on the light-receiving surface of the substrate (for example, the Si substrate) (102), and has the Al electrode (the first electrode) (112) with Al as major component and the silver electrode (the second electrode) (114) with Ag as major component are on the backside.

3. Evaluation of the Cell

The electrical characteristics (I-V characteristics) of the resulting solar cell substrate were evaluated using a model NCT-M-150AA cell tester manufactured by NPC Co. Five samples were prepared for each paste, and the average value for the five samples was used.

The characteristic values obtained were Eff: conversion efficiency (%), FF: fill factor (%), Voc: open voltage (mV), Jsc: short circuit current ($mA.cm^2$), Rs: series resistance ($\Omega.cm^2$), and Rsh: shunt resistance ($\Omega.cm^2$). Except for Rs, higher values correspond to better power generation performance of the solar cell. The results are shown in Table 2. The numerical values in Table 2 are relative, with the numerical values of Comparative Example 2 taken as 100.0.

TABLE 2

| Paste type | EFF % | FF % | Voc mV | JSC mA/cm2 | Rs Ohm cm2 | Rsh Ohm cm2 |
|---|---|---|---|---|---|---|
| Comparative Example 1 | 81.3 | 92.3 | 92.2 | 93.1 | 98.2 | 44.3 |
| Comparative Example 2 | 100.0 | 100.0 | 100.0 | 100.0 | 100.0 | 100.0 |
| Application Example 1 | 127.3 | 120.8 | 97.9 | 108.7 | 33.6 | 89.3 |
| Application Example 2 | 147.7 | 143.0 | 99.6 | 104.9 | 26.4 | 322.3 |
| Application Example 3 | 128.6 | 126.6 | 99.8 | 103.3 | 38.5 | 152.9 |

As indicated above, adding the sintering inhibitor improves the characteristics of the solar cells.

What is claimed is:

1. A method for the manufacture of a solar cell electrode comprising:

applying to a solar cell substrate a paste comprising a silver powder, a glass frit, a resin binder and a metal resinate; and then firing the paste, wherein the metal resinate is expressed by the following general formula (I), $$Me(XR)_n \quad (I)$$

Me is selected from the group consisting of manganese, titanium, bismuth, palladium, platinum, zirconia, boron, barium, aluminum, copper, gold, indium, iron, nickel, ruthenium, rhodium, silicon, silver and tin, X is selected from the group consisting of —S—, —O(CO)— and —$SO_3$—, R is selected from the group consisting of linear, branched and cyclic hydrocarbons having 1 to 10 carbon atoms, and n is 1, 2 or 3.

2. A method for the manufacture of a solar cell electrode according to claim 1, wherein the metal resinate is rhodium resinate.

3. A method for the manufacture of a solar cell electrode according to claim 1, wherein the metal resinate content is 0.002-0.05 wt % based on the weight of the paste.

4. A method for the manufacture of a solar cell electrode according to claim 1, wherein the diameter of the silver powder is 0.1-10.0 μm.

5. A method for the manufacture of a solar cell electrode according to claim 4, wherein the silver powder is of 99+% purity.

6. A method for the manufacture of a solar cell electrode according to claim 1, wherein the silver powder content is 40-90 wt % based on the weight of the paste.

7. A method for the manufacture of a solar cell electrode according to claim 1, wherein the glass frit has a softening point at 450-550° C.

8. A method for the manufacture of a solar cell electrode according to claim 1, wherein the glass frit content is 0.5-10 wt % based on the weight of the paste.

9. A method for the manufacture of a solar cell electrode according to claim 1, wherein the resin binder content is 10-50 wt % based on the weight of the paste.

10. A method for the manufacture of a solar cell electrode according to claim 1, wherein said R is selected from the group consisting of methyl, ethyl, n-propyl, isopropyl, cyclopropyl, n-butyl, isobutyl, t-butyl, cyclobutyl, n-pentyl, cyclopentyl, other pentyl groups, n-hexyl, cyclohexyl, other hexyl groups, n-heptyl, other heptyl groups, n-octyl, other octyl groups, n-nonyl, other nonyl groups, n-decyl and other decyl groups.

11. A solar cell electrode manufactured by the method of claim 1.

* * * * *